(12) United States Patent
Nam et al.

(10) Patent No.: US 9,528,185 B2
(45) Date of Patent: Dec. 27, 2016

(54) PLASMA UNIFORMITY CONTROL BY ARRAYS OF UNIT CELL PLASMAS

(71) Applicant: Applied Materials, Inc., Santa Clara, CA (US)

(72) Inventors: Sang Ki Nam, Danville, CA (US); Tae Seung Cho, San Jose, CA (US); Ludovic Godet, Sunnyvale, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/489,398

(22) Filed: Sep. 17, 2014

(65) Prior Publication Data
US 2016/0053376 A1 Feb. 25, 2016

Related U.S. Application Data

(60) Provisional application No. 62/040,901, filed on Aug. 22, 2014.

(51) Int. Cl.
| | |
|---|---|
| H01L 21/00 | (2006.01) |
| C23C 16/00 | (2006.01) |
| C23C 16/455 | (2006.01) |
| H01J 37/32 | (2006.01) |
| C23C 16/509 | (2006.01) |
| C23C 16/52 | (2006.01) |

(52) U.S. Cl.
CPC ..... *C23C 16/45565* (2013.01); *C23C 16/5096* (2013.01); *C23C 16/52* (2013.01); *H01J 37/3244* (2013.01); *H01J 37/32082* (2013.01); *H01J 37/32357* (2013.01)

(58) Field of Classification Search
None
See application file for complete search history.

(56) References Cited

U.S. PATENT DOCUMENTS

| | | | |
|---|---|---|---|
| 6,207,487 B1 | 3/2001 | Kim et al. | |
| 6,242,808 B1 | 6/2001 | Shimizu et al. | |
| 6,251,242 B1 | 6/2001 | Fu et al. | |
| 6,277,249 B1 | 8/2001 | Gopalraja et al. | |

(Continued)

FOREIGN PATENT DOCUMENTS

JP 08227880 A * 9/1996

OTHER PUBLICATIONS

PCT/US2015/044091—International Search Report and Written Opinion dated Nov. 19, 2015, 13 pages.

*Primary Examiner* — Anna Crowell
(74) *Attorney, Agent, or Firm* — Patterson & Sheridan, LLP

(57) ABSTRACT

The present invention provides an apparatus having a plasma profile control plate disposed in a plasma processing chamber so as to locally alter plasma density to provide uniform plasma distribution across a substrate surface during processing. In one embodiment, a process kit includes a plate configured to be disposed in a plasma processing chamber, a plurality of apertures formed therethrough, the apertures configured to permit processing gases to flow through the plate, and an array of unit cells including at least one aperture formed in the plate, wherein each unit cell has an electrode assembly individually controllable relative to electrode assemblies disposed in at least two other unit cells.

9 Claims, 5 Drawing Sheets

(56) References Cited

U.S. PATENT DOCUMENTS

| | | |
|---|---|---|
| 6,284,646 B1 | 9/2001 | Leem |
| 6,305,314 B1 | 10/2001 | Sneh et al. |
| 6,335,240 B1 | 1/2002 | Kim et al. |
| 6,344,419 B1 | 2/2002 | Forster et al. |
| 6,348,376 B2 | 2/2002 | Lim et al. |
| 6,358,829 B2 | 3/2002 | Yoon et al. |
| 6,372,598 B2 | 4/2002 | Kang et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,528,947 B1 * | 3/2003 | Chen .................. H01J 37/32596 118/723 R |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 7,543,546 B2 * | 6/2009 | Shibata ............... H01J 37/32009 118/723 E |
| 7,976,674 B2 * | 7/2011 | Brcka ............... H01J 37/32082 118/723 AN |
| 2002/0129769 A1 | 9/2002 | Kim et al. |
| 2003/0052085 A1 * | 3/2003 | Parsons ............. H01J 37/32082 216/60 |
| 2003/0059538 A1 | 3/2003 | Chung et al. |
| 2003/0079983 A1 * | 5/2003 | Long ................. H01J 37/32082 204/164 |
| 2006/0102286 A1 | 5/2006 | Kim |
| 2006/0137820 A1 | 6/2006 | Lee et al. |
| 2007/0037408 A1 * | 2/2007 | Tachibana ........... C23C 16/0245 438/778 |
| 2007/0209931 A1 | 9/2007 | Miller |
| 2009/0211707 A1 | 8/2009 | Chao et al. |
| 2009/0308739 A1 | 12/2009 | Riker et al. |
| 2010/0096253 A1 | 4/2010 | Cao et al. |
| 2011/0248633 A1 | 10/2011 | Nauman et al. |
| 2012/0222616 A1 | 9/2012 | Han et al. |
| 2012/0255678 A1 * | 10/2012 | Holland ............. H01J 37/32596 156/345.33 |
| 2012/0258555 A1 * | 10/2012 | Holland ............. H01J 37/32596 438/5 |
| 2012/0264291 A1 | 10/2012 | Ganguli et al. |

* cited by examiner

PLASMA UNIFORMITY CONTROL BY ARRAYS OF UNIT CELL PLASMAS

CROSS-REFERENCE TO RELATED APPLICATIONS

This application claims benefit of U.S. Provisional Application Ser. No. 62/040,901, filed Aug. 22, 2014, of which is incorporated by reference in its entirety.

BACKGROUND OF THE DISCLOSURE

Field

Embodiments of the disclosure generally relate to a plasma profile control plate utilized in a plasma processing chamber for forming a plasma with uniform distribution, and more particularly, a plasma profile control plate with individual controllable cells to locally alter and control plasma distribution across a substrate surface disposed in a plasma processing chamber in a semiconductor manufacturing process.

Description of the Background Art

Reliably producing submicron and smaller features is one of the key technologies for the next generation of very large scale integration (VLSI) and ultra large scale integration (ULSI) of semiconductor devices. However, as the miniaturization of circuit technology is pressed, the shrinking dimensions of interconnects in VLSI and ULSI technology have placed additional demands on the processing capabilities. The multilevel interconnects that lie at the heart of this technology require precise processing of high aspect ratio features, such as vies and other interconnects. Reliable formation of these interconnects is very important to VLSI and ULSI success and to the continued effort to increase circuit density and quality of individual substrates.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features.

Many semiconductor devices are processed in the presence of a plasma. The plasma may be easily ignited in processing chambers that utilized capacitively coupled power, inductively coupled power, or microwave power to energize the gases forming the plasma. However, the plasma generated in the processing chamber may often not be uniformly distributed all across an entire surface of the substrate. For example, the plasma may not always extend to an edge of the substrate, resulting in different edge to center processing rates. Non-uniform plasma distribution at different locations across the substrate surface may result in asymmetrical or non-uniform processing profiles of the target-processing material disposed on the substrate. As such, non-uniform plasma distribution across the substrate surface may eventually result in defects, such as feature deformation, line edge roughness or tapered top portion of the features translated into the target-processing material.

Therefore, there is a need for an improved method and apparatus for uniform plasma distribution control across a substrate surface during a plasma process.

SUMMARY

The present disclosure provides an apparatus having a plasma profile control plate disposed in a plasma processing chamber so as to locally alter plasma density to provide uniform plasma distribution across a substrate surface during processing. In one embodiment, a process kit includes a plate configured to be disposed in a plasma processing chamber, a plurality of apertures formed therethrough, the apertures configured to permit processing gases to flow through the plate, and an array of unit cells including at least one aperture formed in the plate, wherein each unit cell has an electrode assembly individually controllable relative to electrode assemblies disposed in at least two other unit cells.

In another embodiment, a plasma processing chamber includes a showerhead assembly having a first plurality of apertures formed therein, a plasma profile control plate assembly having a second plurality of apertures formed therein disposed adjacent to the showerhead assembly, wherein the second plurality of apertures are aligned with the first plurality of apertures that allow processing gases to flow therethrough, and an array of unit cells disposed in the showerhead assembly or in the plasma profile control plate, wherein at least two unit cells are individually powerable relative to the other unit cells.

In yet another embodiment, a method for controlling profile of a plasma formed in a plasma processing chamber includes supplying a processing gas through a showerhead assembly and a plasma profile control plate to a processing region defined in a processing chamber, individually applying different power levels to different unit cells defined in the showerhead assembly or in the plasma profile control plate, and forming plasma with different local plasma density in the unit cell having the applied power.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary examples of this invention and are therefore not to be considered limiting of its scope, for the invention may admit to other equally effective embodiments.

DETAILED DESCRIPTION

A plasma processing apparatus having a plasma profile control plate and methods of plasma processing using the same are disclosed herein. The plasma profile control plate may comprise an array of plasma unit cells that may be individually controllable supply different levels of power to addressably alter the density, profile and distribution of a plasma present in the processing chamber. By doing so, plasma distribution may be locally changed or altered so as to provide a uniform plasma distribution across a substrate surface disposed in the plasma processing apparatus, thereby enhancing the uniformity of plasma processing results.

Figure 1:
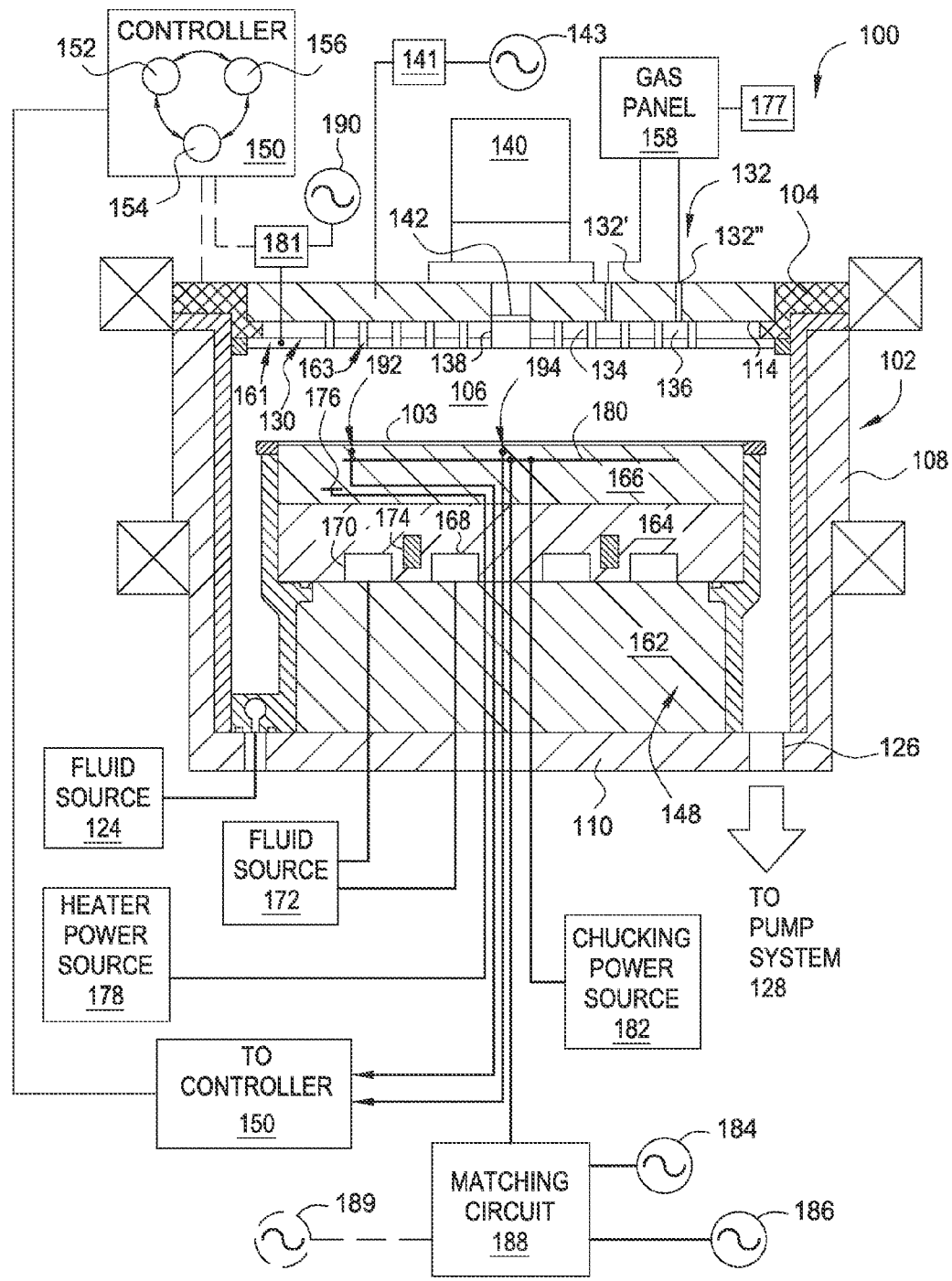
FIG. 1 depicts a schematic cross-sectional view of one example of a process chamber having a plasma profile control plate.

FIG. 1 is a sectional view of one example of a processing chamber 100 suitable for performing a plasma process on a material layer disposed on a substrate. Suitable processing chambers that may be adapted for use with the teachings disclosed herein include, for example, an ENABLER® or C3® processing chamber available from Applied Materials, Inc. of Santa Clara, Calif. Although the processing chamber 100 is shown including a plurality of features that enable superior plasma processing performance, it is contemplated that other processing chambers may be adapted to benefit from one or more of the inventive features disclosed herein. It is noted that any type of plasma processing chambers, including etching, deposition, plasma ion implant, plasma immersion, or any suitable plasma processes, may also be adapted to benefited from the present disclosure.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one implementation, the pump system 128 maintains the pressure inside the interior volume 106 at operating pressures between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one implementation, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In one implementation, the gas panel 158 is adapted to provide fluorinated process gas through the inlet ports 132', 132" and into the interior volume 106 of the processing chamber 100. In one implementation, the process gas provided from the gas panel 158 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_1F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include $HCl$, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures 163 that allow the gases flowing through the showerhead assembly 130 from the inlet ports 132', 132" into the interior volume 106 of the processing chamber 100 in a predefined distribution across the surface of the substrate 103 being processed in the processing chamber 100.

A plasma profile control plate 161 may be coupled to the showerhead assembly 130. A plurality of apertures formed in the plasma profile control plate 161 aligned with the apertures 163 formed in the showerhead assembly 130 so as to facilitate gas flow through the showerhead assembly 130 into the interior region 106 of the processing chamber 100. The plasma profile control plate 161 is coupled to a power source 190 through a switching circuit 181. Details regarding the structures and configurations of the showerhead assembly 130 and the plasma profile control plate 161 will be further discussed below with reference to FIG. 2 to FIG. 4B.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one implementation, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130 and the plasma profile control plate 161. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one implementation, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130 and the plasma profile control plate 161. The electrostatic chuck 266 is driven by a chucking power source 282 to develop an electrostatic force that holds the substrate 103 to the chuck surface, as is conventionally known. Alternatively, the substrate 103 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 103 disposed thereon. The temperature of the electrostatic chuck 166 and the base 164 may be monitored using a plurality of temperature sensors 192, 194. The electrostatic chuck 166 may further comprise a plurality of gas passages (not shown), such as grooves, that are formed in a substrate support pedestal supporting surface of the chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 103.

In one implementation, the substrate support pedestal assembly 148 is configured as a cathode and includes an electrode 180 that is coupled to a plurality of RF power bias sources 184, 186. The RF bias power sources 184, 186 are coupled between the electrode 280 disposed in the substrate support pedestal assembly 148 and another electrode, such as the showerhead assembly 130 (or the plasma profile control plate 161) or ceiling (lid 104) of the chamber body 102. The RF bias power excites and sustains a plasma discharge formed from the gases disposed in the processing region of the chamber body 102.

In the example depicted in FIG. 1, the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

In one mode of operation, the substrate 103 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing processing by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting. The software routines can be stored in the memory 154, such as random access memory, read only memory, floppy, or hard disk drive, or other form of digital storage. The support circuit 156 is conventionally coupled to the CPU 152 and may include cache, dock circuits, input/output systems, power supplies, and the like. Bi-directional communications between the controller 150 and the various components of the processing chamber 100 are handled through numerous signal cables.

Figure 2:
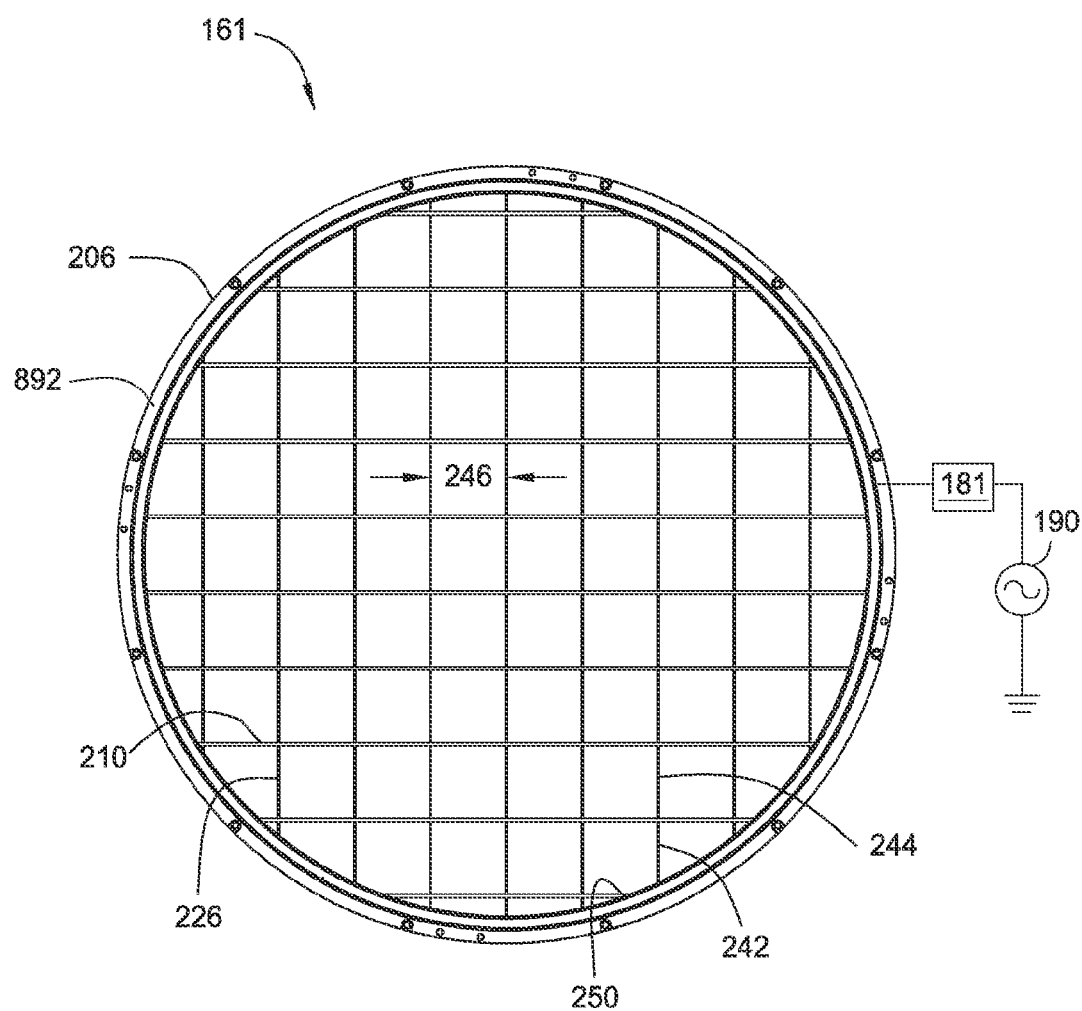
FIG. 2 depicts a top view of one example of the plasma profile control plate.

FIG. 2 depicts a top view of the plasma profile control plate 161 that may be disposed in the processing chamber 100 of FIG. 1. The plasma profile control plate 161 is generally planar structure having square or rectangular structure having walls 226 separating an array of cells 244 arranged in a close-packed arrangement. Each cell 244 forms an aperture through the plate 161. An aspect ratio of the square cells 244 may be defined as the depth of the cells 244 divided by the width 246 of the cell 244. In one example, the thickness of the walls 226 is between about 0.1 inches and about 3 inches. In one embodiment, the plasma profile control plate 161 is comprised of a material selected from aluminum, copper, and stainless steel. In one example, the walls 226 and the cells 244 have a close packed polygonal structures, such as square or hexagonal. In other examples, the walls 226 and cells 244 have other non-polygonal geometry to provide apertures through the plate 161 in a close-packed or spaced arrangement.

The structure of the each cell 244 formed in the plasma profile control plate 161 may serve as a plasma profile optimizer to optimize the uniformity of flow path, ion fraction, plasma distribution and ion trajectory behavior of ions passing through the plasma profile control plate 161.

In one embodiment, the plasma profile control plate 161 may be machined or formed from a single mass of aluminum. The plasma profile control plate 161 may optionally be coated or anodized. Suitable coating materials include rare earth metal dielectric materials, such as silicon carbide, aluminum nitride, aluminum oxide, aluminum oxynitride, yttrium containing materials, yttrium oxide ($Y_2O_3$), yttrium-aluminum-garnet (YAG), titanium oxide (TiO), or titanium nitride (TiN), or the like. Alternatively, the plasma profile control plate 161 may be made from other materials compatible with the processing environment, and may also be comprised of one or more sections.

The plasma profile control plate 161 functions as a plasma distribution controller to and addressably locally enhance or redistribute ions and neutrals to be accelerated toward the substrate 103. The plasma profile control plate 161 may have an aspect ratio change across the width of the plasma profile control plate 161 as needed to allow different percentage of ions passing therethrough so as to alter plasma distribution across the width of the processing chamber. As a result, both distribution of plasma and the number of ions traveled onto peripheral regions and center regions of the substrate 103 are adjusted and controlled.

In one embodiment, the power source 190 coupled to the plasma profile control plate 161 through the switching circuit 181 may supply power to the plasma profile control plate 161 in a continuous mode, or in pulsing or alternating fashion to assist locally changing of the plasma generated in each cell 244 of the plasma profile control plate 161. The power source 190 is configured to provide negative and/or positive voltage, either in pulse mode or in continuous mode, to the plasma profile control plate 161 so as to control the plasma distribution passing through the plasma profile control plate 161.

It is believed that voltage from the power source 190 applied to the plasma profile control plate 161 may draw or repel electrons in the plasma so as to alert the distribution and profile of the plasma passing therethrough. Furthermore, the switching circuit 181 coupled to the profile control plate may assist switching the power to different unit cells 244 formed in the plasma profile control plate 161. Thus, by locally applying different voltage levels to different cells 244 defined in the plasma profile control plate 161, plasma distribution, density, strength, profile, and ion flux may be locally and individually controlled, so that directionality of the ions and neutrals and plasma distribution may be efficiently controlled.

FIG. 3 depicts a cross sectional view of one embodiment of a portion of the showerhead assembly 130 and the plasma profile control plate 161 attached to the showerhead assembly 130. The showerhead assembly 130 includes the array of unit cells 244, shown as 302a, 302b, 302c, 302d. Each cell 244 includes a first plurality of apertures, shown as 308a, 308b, 308c, 308d and a second plurality of apertures 309a, 309b, 309c, 309d aligning with the apertures 308a, 308b, 308c, 308d that allows processing gases 316 to pass therethrough.

In one embodiment, the first plurality of apertures 308a, 308b, 308c, 308d formed in the showerhead assembly 130 has a diameter between about 1 mm and about 100 mm. The second plurality of apertures 309a, 309b, 309c, 309d has a diameter substantially matched with the diameters of the apertures 308a, 308b, 308c, 308d formed in the showerhead assembly 130. Alternatively, the second plurality of apertures 309a, 309b, 309c, 309d may have a diameter between about 1 mm and about 100 mm.

In one embodiment, the plasma profile control plate 161 may be removably coupled to the showerhead assembly 130. Alternatively, the plasma profile control plate 161 may be formed as an integral part of the showerhead assembly 130.

The showerhead assembly 130 further includes an electrode assembly 305. The electrode assembly 305 disposed in the showerhead assembly 130 includes at least two sets of electrodes 304, 306, one of which functioning as a cathode and the other functioning as an anode. A cavity 318 may be formed between the electrodes 304, 306 that allow the processing gases supplied thereto to generate a plasma 312 when the electrodes 304, 306 are powered. Each electrode 304, 306 may be charged with the same or different voltage levels as needed from the power source 190 controlled by the switching circuit 181. Each electrode 304, 306 may each have a plurality of geometric forms disposed in each unit cells 302a, 302b, 302c, 302d. In one embodiment, the electrode 304, 306 may be in form of a series of segments individually disposed in each unit cells 302a, 302b, 302c, 302d of the showerhead assembly 130. Each segment of the electrodes 304, 306 located in each unit cell 302a, 302b, 302c, 302d may be individually powered and controllable. That is, the electrodes 304, 304 of cell 302a may be controlled separately and independently of the voltages applied to at least on other cell (cell 302b for example) by control of the switching circuit 181 coupled to the power source 190. Thus, each cell 244 may be addressably powered independently of the other cells 244. In the situations when a processing chamber configuration provides a non-uniform plasma distribution across the substrate surface, the voltage selectively applied to the electrodes 304, 306 located in each unit cell 302a, 302b, 302c, 302d may be individually controlled so as to locally change the density, intensity and strength of the plasma 312 as generated in the cavity 318 of each cell 244, so as to assist making the plasma uniform across the substrate surface.

In one example, the showerhead assembly 130 and the plasma profile control plate 161 may be fabricated from similar materials. For example, the showerhead assembly 130 and the plasma profile control plate 161 may be fabricated from a metallic material, such as aluminum, aluminum alloy, aluminum silicon alloy, stainless steel or other suitable materials.

In one example, the upper electrode 304 may serve as an anode and the lower electrode 306 may serve as a cathode when powered. When the electrodes 304, 306 of a selected cell 244 are powered, the plasma 312 may be formed in the cavity 318 of that cell 244 to dissociate processing gases with ions, neutrals, charges, electrons and radicals. By locally applying different power levels of the voltage to each unit cell 302a, 302b, 302c, 302d, the plasma 312 as generated between the upper electrode 304 and the lower electrode 306 may be individually changed in each unit cell 302a, 302b, 302c, 302d, so as to locally change plasma distribution, profile, density, or intensity, so as to compensate for non-uniformity in the plasma disposed between the plasma profile control plate 161 and the substrate 103. Thus, as each cell 244 may be individually addressed to provide a plasma within each individual cell 244, the plasma profile control plate 161 may compensate and correct plasma non-uniformities that may be created by asymmetrical chamber designs, RF asymmetries, and gas flow asymmetries.

The power source 190 is configured to provide a voltage power to the upper and lower electrodes 304, 306 to generate the plasma 312 therebetween. In one embodiment, the power source 190 may be configured to provide a DC or AC power to the upper and the lower electrode 304, 306. The voltage as supplied from the power source 190 to the upper and lower electrodes 304, 306 may be controlled in a pulsed mode to pulse alternating positive and negative voltages to the upper and lower electrodes 304, 306. Alternatively, the voltage as supplied from the power source 190 may be in continuous mode as needed. The power, either in continuous mode or in pulse mode may be modulated to effectuate a locally controllable format so as to provide a desired deposition/etching profile of a target material disposed on the substrate.

During operation, a voltage may be applied to the upper or the lower electrode 304, 306, or both, to generate the plasma 312 in presence of a processing gas 316 supplied in the cavity 318. When the power from the power source 190 is applied in pulse mode, the pulsed power may have a duty cycle between about 5 percent (e.g., 5 percent on and 95 percent off) to about 70 percent (e.g., 70 percent on and 30 percent off), such as between about 5 percent and about 50 percent, such as between about 15 percent to 45 percent, at a frequency between about 2 Hz and about 60 MHz. Alternatively, the cycle of the voltage power pulsed to the showerhead assembly 130 may be controlled by a predetermined number of time periods performed. For example, the voltage power may be pulsed between about every 1 millisecond and about every 100 milliseconds. In one embodiment, the power may be controlled at between about 1 KWatts and about 10 KWatts. In the embodiment wherein a continuous mode is applied, the power may be supplied to the showerhead assembly 130 between about 0.1 KWatts and about 500 KWatts.

When applying the power from the power source 190, the gas mixture as supplied may include reactive gas, non-reactive gas, inert gas, and the like. Examples of reactive and non-reactive gas include, but not limited to, halogen containing gas, hydrocarbon containing gas, silicon containing gas, carbon containing gas, $I_2$, $N_2$, $N_2O$, $NO_2$, $NH_3$, and $H_2O$, among others. Examples of inert gas include, but not limited to, Ar, Ne, He, Xe, and Kr, among others.

Figure 3A:
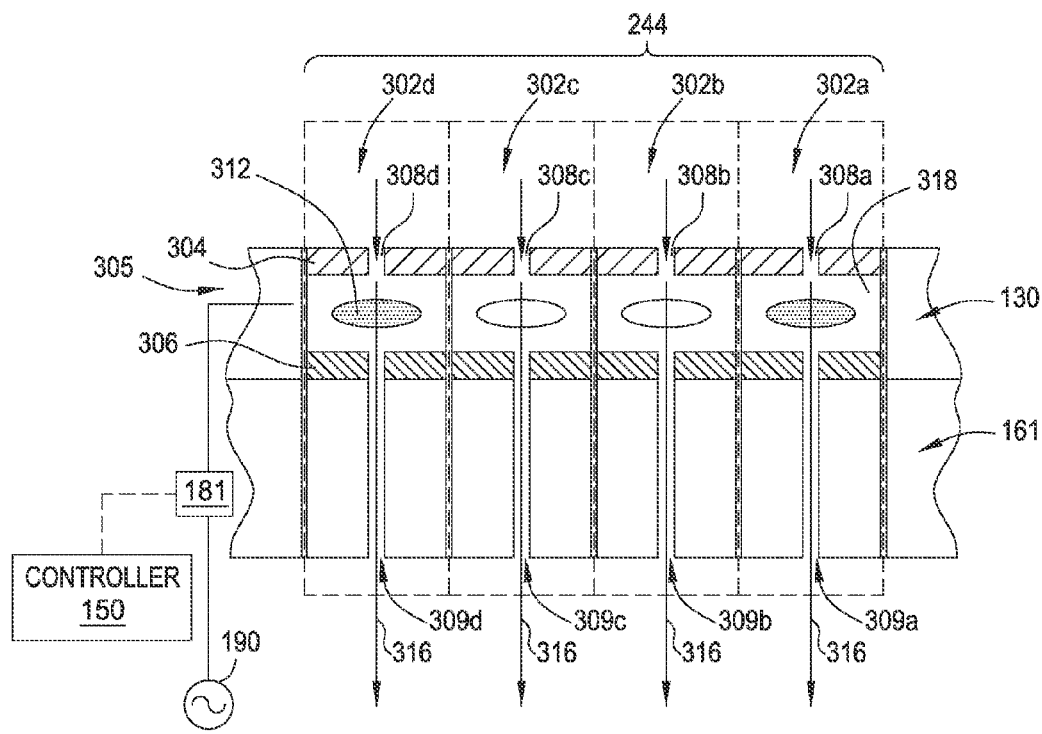
FIG. 3A depicts a cross sectional view of a plasma profile control plate that may be utilized in a plasma processing chamber.
Figure 3B:
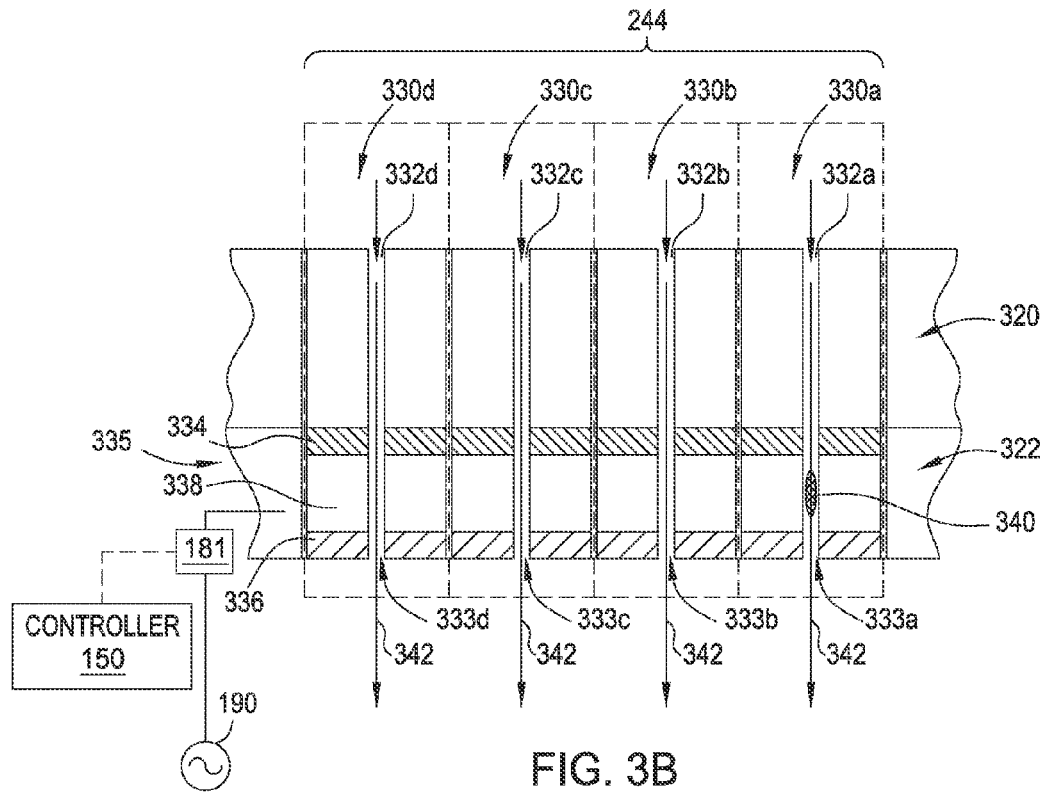
FIG. 3B depicts a cross sectional view of another example of a plasma profile control plate that may be utilized in a plasma processing chamber.

FIG. 3B depicts a cross sectional view of another example of a portion of a showerhead assembly 320 and a plasma profile control plate 322 attached to the showerhead assembly 320. The showerhead assembly 320 and the plasma profile control plate 322 may be similar to the showerhead assembly 130 and the plasma profile control plate 161 depicted above which may be implemented into the processing chamber 100. Similar to the configuration of the showerhead assembly 130 and the plasma profile control plate 161 depicted in FIG. 3A, instead of forming the electrode assembly 305 in the showerhead assembly 130, an electrode assembly 335, similar to the electrode assembly 305 depicted in FIG. 3A, is disposed in the plasma profile control plate 322. The electrode assembly 335 includes an upper electrode 334 and a lower electrode 336 disposed therein. Similarly, the upper electrode 334 and the lower electrode 336 may be in form of metallic segments located in each unit cells 244, individually showing as unit cells 330a, 330b, 330c, 330d. Similarly, the showerhead assembly 320 includes a first plurality of apertures 332a, 332b, 332c, 332d formed therein defined in each unit cell 330a, 330b, 330c, 330d. The plasma profile control plate includes a second plurality of apertures 333a, 333b, 333c, 333d formed therein aligning with the first plurality of apertures 332a, 332b, 332c, 332d formed in the showerhead assembly 320 defined in each unit cell 330a, 330b, 330c, 330d.

In one example, a cavity 338 may or may not be formed between the upper and lower electrodes 334, 336. In the embodiment wherein the cavity 338 is formed therebetween, the processing gas 342 flowing therethrough may have a wider window to extend when forming a plasma, thus providing a space for a more thorough ion dissociation. In the embodiment wherein the cavity 338 is not formed, the plasma 340 as generated may stay in the apertures 333d defined in each unit cell 330a, 330b, 330c, 330d.

The power source 190 may be coupled to the plasma profile control plate 322 to individually and locally control plasma generation in each unit cell 330a, 330b, 330c, 330d, as the manner described above with reference to FIG. 3A. The power source 190 applied to the plasma profile control plate 322 may be in pulse mode or in continuous mode as needed.

Figure 4A:
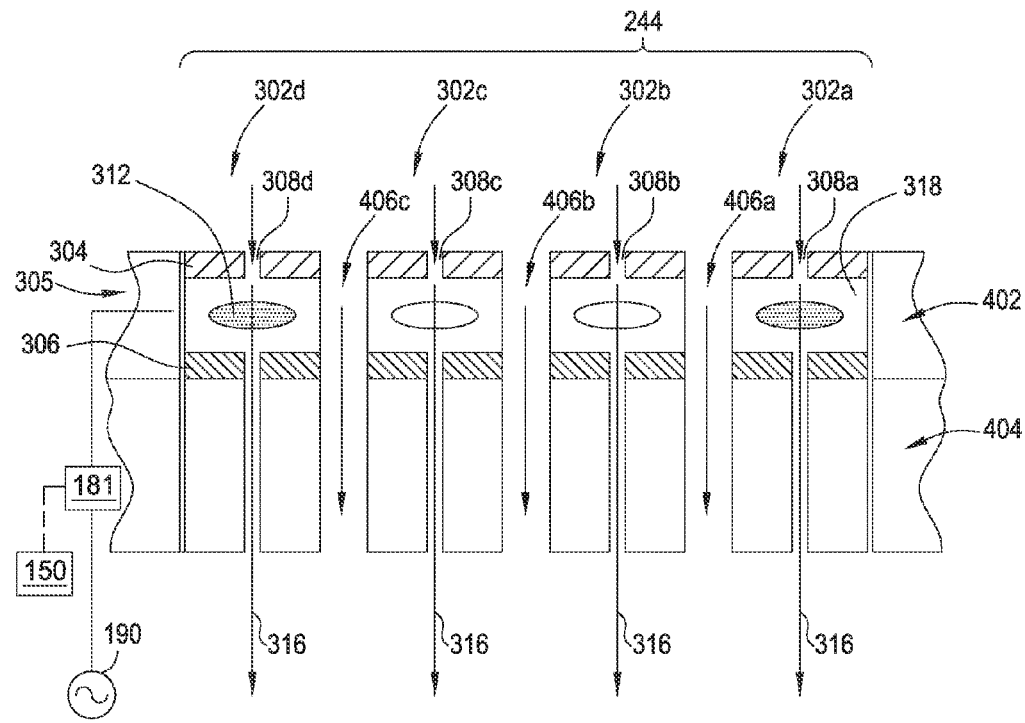
FIG. 4A depicts a cross sectional view of yet another example of a plasma profile control plate that may be utilized in a plasma processing chamber.
Figure 4B:
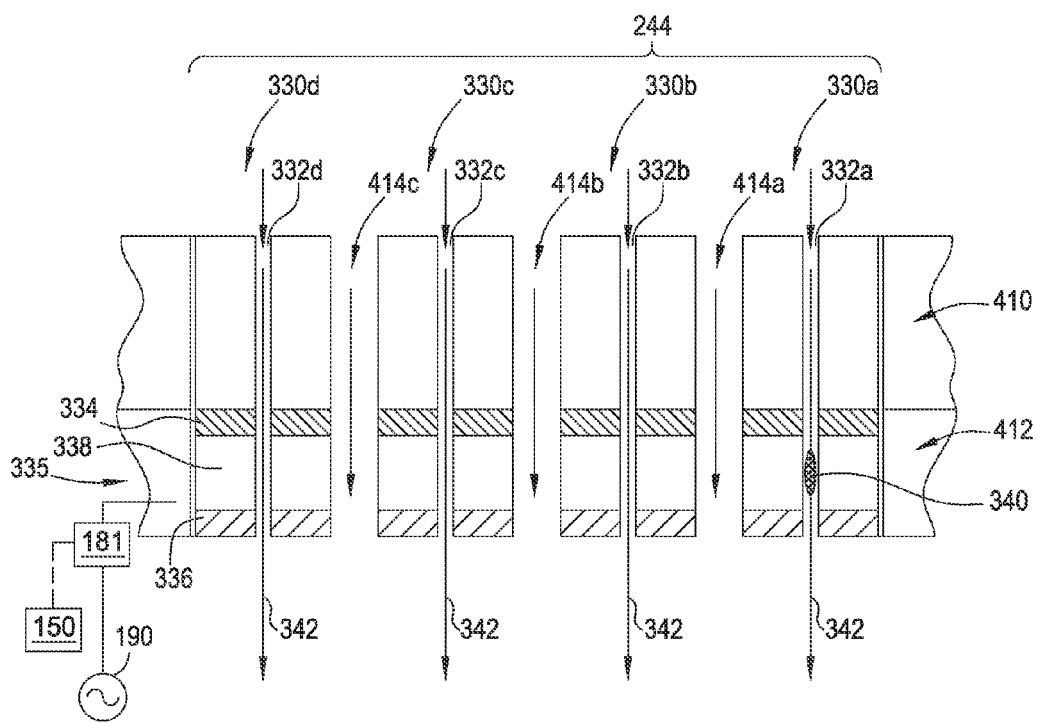
FIG. 4B depicts a cross sectional view of still another example of a plasma profile control plate that may be utilized in a plasma processing chamber.

FIGS. 4A and 43 depict different embodiments of portions of showerhead assemblies 402, 410 and plasma profile control plates 404, 412 respectively. Similar to the configuration of the showerhead assembly 130 and the plasma profile control plate 161 described in FIG. 3A, the electrode assembly 305 is disposed in the showerhead assembly 402 and the plasma profile control plate 404 attached to the showerhead assembly 402 while with additional passages 406a, 406b, 406c formed in between each unit cell 302a, 302b, 302c, 302d defined in the showerhead assembly 402 and the plasma profile control plate 404. It is believed that the additional passages 406a, 406b, 406c formed in the showerhead assembly 402 and the plasma profile control plate 404 may assist carrying a greater amount of processing gases into the processing chamber, as compared to the example shown in FIG. 3A, so as to assist providing a more uniform distribution of the plasma formed across the substrate surface.

Similarly, in the example depicted in FIG. 43, the electrode assembly 335 is disposed in the plasma profile control plate 412 attached to the showerhead assembly 410, similar to the configuration described in FIG. 3B. Additional passages 414a, 414b, 414c and formed in between each unit cell 330a, 330b, 330c, 330d defined in the showerhead assembly 410 and the plasma profile control plate 412. It is believed that the additional passages 406a, 406b, 406c formed in the showerhead assembly 402 and the plasma profile control plate 404 may assist carrying greater amount of processing gases into the processing chamber, as compared to the example shown in FIG. 3B, so as to assist providing a more uniform distribution of the plasma formed across the substrate surface.

Figure 5:
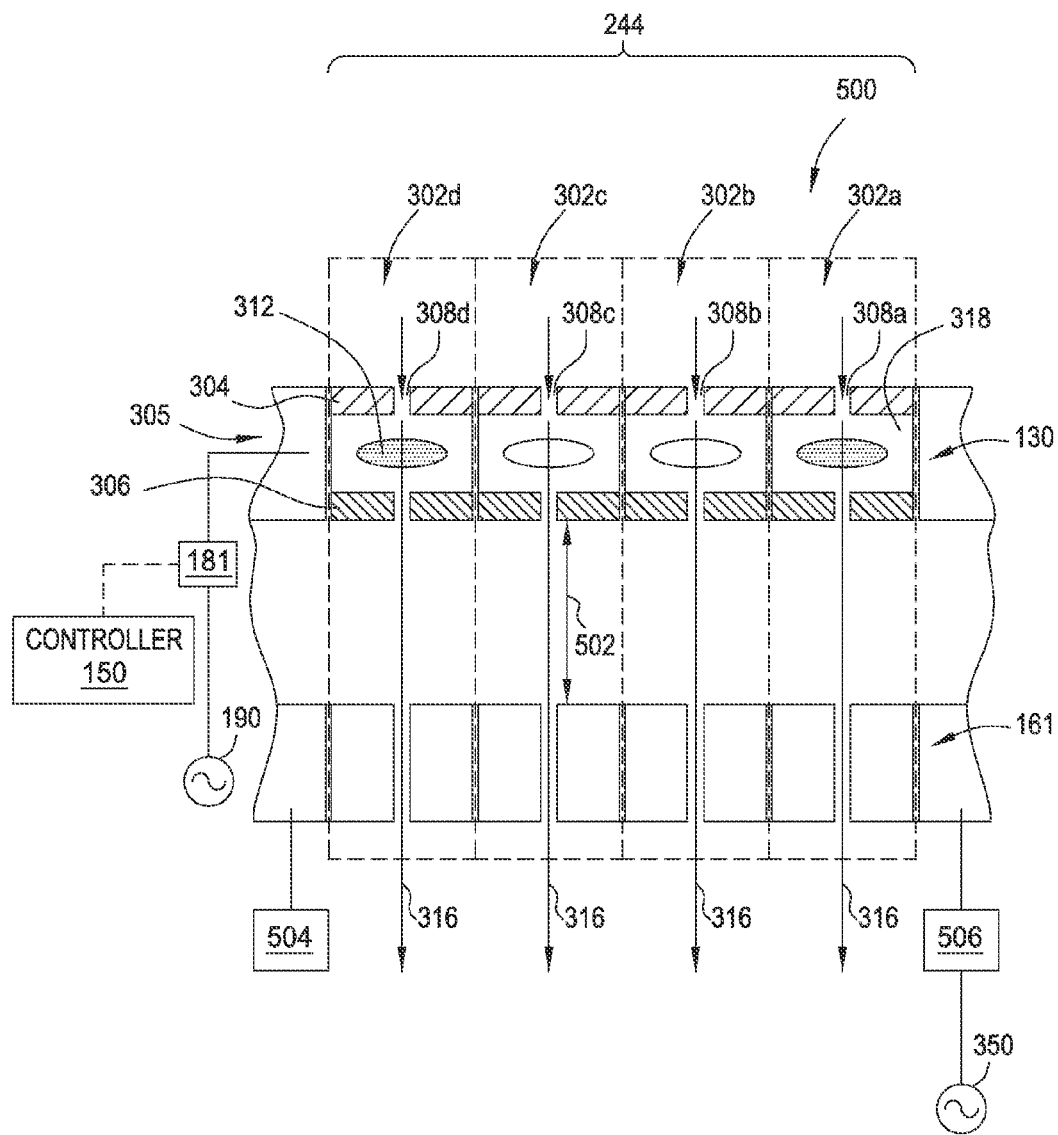
FIG. 5 depicts a cross sectional view of still another example of a plasma profile control plate and a showerhead plate that may be utilized in a plasma processing chamber.

FIG. 5 depicts yet another example of the showerhead assembly 230 and the plasma profile control plate 161 configured in a spaced-apart relationship. Although the example depicted in FIG. 5 has the electrode assembly 305 disposed in the showerhead assembly 130 without additional passages 406a, 406b, 406c formed therebetween, it is noted that the electrode assembly 305 may be disposed in the plasma profile control plate 161 as described above with reference to FIGS. 3B and 4B, with or without the additional passages 414a, 414b, 414c formed therein. In one embodiment, the showerhead assembly 230 and the plasma profile control plate 161 may be spaced by a distance 502 to the showerhead assembly 130 to avoid possible interference when a power is applied to the showerhead assembly 130 and the plasma profile control plate 161. In the embodiment where the electrode assembly 305 is disposed in the showerhead assembly 130, as depicted in FIG. 5, the voltage power is then applied to the electrode assembly 305 disposed in the showerhead assembly 130 through the power source 190. For example, voltage applied to the showerhead assembly 130 may generate a current that may create interference to the nearby metallic materials, such as the plasma profile control plate 161. As a result, plasma arcing, electrical spikes, or charging may be adversely generated due to excess charge accumulation or current interface. Accordingly, by maintaining the showerhead assembly 130 and the plasma profile control plate 261 in a spaced-apart relationship, undesired current interference or excess charge accumulation may be eliminated, thereby efficient reducing the likelihood of particle, defect generation and contribution to plasma non-uniformity.

Thus, apparatus having an electrode assembly disposed either in a showerhead assembly or a plasma profile distribution plate with individual plasma controllable unit cells disposed in a plasma processing chamber and methods of using the same have provided herein. By utilizing an electrode assembly having separately controllable unit cells, unit plasmas formed in each unit cell may be locally and individually controlled, so as to efficiently alter or change plasma density/intensity, ion trajectory behavior or plasma uniformity of the main plasma used to process a substrate.

While the foregoing is directed to embodiments of the present invention, other and further embodiments of the invention may be devised without departing from the basic scope thereof, and the scope thereof is determined by the claims that follow.

What is claimed is:

1. A process kit, comprising:
   a plate configured to be disposed in a plasma processing chamber;
   a plurality of apertures formed therethrough, the apertures configured to permit processing gases to flow through the plate; and
   an array of unit cells defined by at least one of the apertures, wherein each unit cell has an electrode assembly, each electrode assembly disposed in each unit cell is individually controllable by a power source and each electrode assembly includes a first electrode and a second electrode disposed parallel with the first electrode and a cavity defined between the first and the second electrodes.

2. The process kit of claim 1, wherein the plate is a showerhead assembly.

3. The process kit of claim 1, wherein the plate is a plasma profile control plate.

4. The process kit of claim 1,
   wherein the cavity in fluid communication with at least one of the apertures.

5. The process kit of claim 1, wherein the power applied to each of the unit cell is individually controllable relative to the other unit cells.

6. The process kit of claim 1, further comprising:
   a showerhead assembly disposed adjacent the plate.

7. The process kid of claim 6, wherein the showerhead assembly comprises a plurality of apertures aligning with the apertures formed in the plate.

8. The process kit of claim 1, further comprising:
   a passage formed between each unit cell in the plate.

9. The process kit of claim 1, further comprising:
   a coating formed on the plate.

* * * * *